(12) United States Patent
Chou et al.

(10) Patent No.: US 12,442,993 B2
(45) Date of Patent: Oct. 14, 2025

(54) SYSTEM AND METHOD FOR MEASURING ALIGNMENT

(71) Applicant: ROCKLEY PHOTONICS LIMITED, Cheshire (GB)

(72) Inventors: Chia-Te Chou, Brea, CA (US); Albert Benzoni, South Pasadena, CA (US); Michael Lee, Los Angeles, CA (US); Cristian Stagarescu, Los Angeles, CA (US); William Vis, Pasadena, CA (US); Melissa Ziebell, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 268 days.

(21) Appl. No.: 18/257,231

(22) PCT Filed: Dec. 17, 2021

(86) PCT No.: PCT/EP2021/086567
§ 371 (c)(1),
(2) Date: Jun. 13, 2023

(87) PCT Pub. No.: WO2022/129563
PCT Pub. Date: Jun. 23, 2022

(65) Prior Publication Data
US 2024/0094484 A1 Mar. 21, 2024

Related U.S. Application Data

(60) Provisional application No. 63/127,955, filed on Dec. 18, 2020.

(51) Int. Cl.
*G02B 6/42* (2006.01)
*H01L 23/544* (2006.01)

(52) U.S. Cl.
CPC .......... *G02B 6/4224* (2013.01); *H01L 23/544* (2013.01)

(58) Field of Classification Search
None
See application file for complete search history.

(56) References Cited

U.S. PATENT DOCUMENTS

| | | | |
|---|---|---|---|
| 8,773,664 B1 * | 7/2014 | Wang | G03F 7/70633 356/399 |
| 10,852,492 B1 | 12/2020 | Vermeulen et al. | |
| 11,340,400 B2 * | 5/2022 | Kharas | G02B 6/136 |
| 11,953,728 B2 * | 4/2024 | Yu | H01L 21/67751 |

(Continued)

FOREIGN PATENT DOCUMENTS

WO WO 2019/048740 A1 3/2019

OTHER PUBLICATIONS

International Search Report and Written Opinion of PCT/EP2021/086567, Apr. 26, 2022, 13 pages.

*Primary Examiner* — Jerry Rahll
(74) *Attorney, Agent, or Firm* — Womble Bond Dickinson (US) LLP (57) ABSTRACT

A system and method for alignment. In some embodiments, the method includes measuring a first offset, the first offset being an offset along a first direction between a first alignment mark and a second alignment mark, the first alignment mark being an alignment mark on a first edge of a source die, the second alignment mark being an alignment mark on a target wafer, and the first direction being substantially parallel to the first edge of the source die.

15 Claims, 11 Drawing Sheets

(56) References Cited

U.S. PATENT DOCUMENTS

2020/0041721 A1    2/2020  Yu et al.
2020/0278506 A1*  9/2020  Aalto .................... G02B 6/423
2020/0284978 A1    9/2020  Kharas et al.

* cited by examiner

SYSTEM AND METHOD FOR MEASURING ALIGNMENT

CROSS-REFERENCE TO RELATED APPLICATION(S)

This application is a U.S. national stage entry, under 35 U.S.C. § 371, of International Application Number PCT/EP2021/086567, filed on Dec. 17, 2021, which claims priority to and the benefit of U.S. Provisional Application No. 63/127,955, filed Dec. 18, 2020. The entire contents of all of the applications identified in this paragraph are incorporated herein by reference.

FIELD

One or more aspects of embodiments according to the present disclosure relate to multi-chip assemblies, and more particularly to a system and method for measuring misalignments between a source die and a target wafer.

BACKGROUND

In silicon photonics systems, it may be advantageous to bond a chip or "source die", e.g., a III-V chip, to a target wafer, e.g., a silicon photonics integrated circuit. In such a combination, the III-V chip may include, e.g., a waveguide-coupled laser or a waveguide-coupled modulator, and light may be coupled between waveguide facets on the III-V chip (e.g., at an edge of the III-V chip) and waveguide facets on the silicon photonics integrated circuit at interfaces at which the facets are sufficiently close together for light to couple from one waveguide into another. Accurate alignment at such facets may be important for good coupling efficiency.

As such, it may be helpful to perform accurate alignment when the source die is bonded to the target wafer, and also to measure the quality of the alignment after bonding is complete, so that, e.g., assemblies with severe misalignments may be discarded, and so that problems with assembly equipment or processes causing low yields or systematic misalignments may be promptly detected and corrected.

SUMMARY

According to an embodiment of the present invention, there is provided a method, including: measuring a first offset, the first offset being an offset along a first direction between a first alignment mark and a second alignment mark, the first alignment mark being an alignment mark on a first edge of a source die, the second alignment mark being an alignment mark on a target wafer, the first direction being substantially parallel to the first edge of the source die.

In some embodiments: the target wafer is substantially planar, and the first direction is substantially parallel to the target wafer.

In some embodiments: the source die includes a waveguide, on a top surface of the source die, the waveguide having a facet at a third edge of the source die, and the method further includes forming, in one etching operation: the first alignment mark, and the facet.

In some embodiments, the third edge is the same edge as the first edge.

In some embodiments: the target wafer includes a waveguide, on a top surface of the target wafer, the waveguide having a sidewall, and the method further includes forming, in one etching operation: the second alignment mark, and the sidewall.

In some embodiments, the method further includes measuring a second offset, the second offset being an offset along a second direction between a third alignment mark and a fourth alignment mark, wherein: the third alignment mark is an alignment mark on a second edge of the source die, the fourth alignment mark is an alignment mark on the target wafer, the second edge of the source die is substantially perpendicular to the first edge of the source die, the second direction is substantially parallel to the second edge of the source die, and the second direction is substantially parallel to the target wafer.

In some embodiments: the fourth alignment mark is a first pillar on the target wafer.

In some embodiments: the third alignment mark is offset from the first pillar, on a first side of the first pillar, along the second direction, the source die includes a fifth alignment mark, offset from the first pillar, on a second side of the first pillar, along the second direction, and the method includes measuring one or more offsets, along the second direction, between the first pillar, the fourth alignment mark, and the fifth alignment mark.

In some embodiments, the method further includes measuring a third offset, along a third direction, between a top surface of the first pillar and an alignment feature of the source die.

In some embodiments, the third direction is substantially perpendicular to the target wafer.

In some embodiments, the alignment feature is an alignment plane.

In some embodiments, a first portion of the first pillar is under the source die, and a second portion of the first pillar extends beyond the second edge of the source die.

In some embodiments: the target wafer includes a waveguide having a facet, and the method further includes forming, in one etching operation: the first pillar, and the facet of the waveguide of the target wafer.

In some embodiments, the first edge of the source die includes a plurality of alignment marks including the first alignment mark, and the target wafer includes a plurality of corresponding alignment marks including the second alignment mark, each of the corresponding alignment marks corresponding to a respective one of the alignment marks of the first edge of the source die, the alignment marks of the first edge of the source die and the corresponding alignment marks forming a Vernier scale.

In some embodiments, the plurality of corresponding alignment marks includes five alignment marks.

In some embodiments: the target wafer includes a second pillar, a first portion of the second pillar is under the source die, a second portion of the second pillar extends beyond a third edge of the source die, the third edge of the source die is substantially parallel to the first edge of the source die, and the method further includes measuring a fourth offset, along a direction substantially perpendicular to the target wafer, between a top surface of the second pillar and an alignment feature of the source die.

In some embodiments: the top surface of the source die includes a fiducial mark, the target wafer includes a fiducial mark, and the method further includes placing the source die on the target wafer at a position based on: the position of the fiducial mark on the source die; and the position of the fiducial mark on the top surface of the target wafer.

In some embodiments, the measuring of the first offset includes acquiring an image, the image including the first alignment mark and the second alignment mark.

According to an embodiment of the present invention, there is provided a source die having a top surface and a plurality of edges, the source die including: a waveguide, on the top surface of the source die, the waveguide extending to a waveguide facet, the waveguide facet having a first wall height, and a first alignment mark, on a first edge of the source die, the first alignment mark having a second wall height, the second wall height being within 5% of the first wall height.

According to an embodiment of the present invention, there is provided a target wafer configured to receive, at a nominal position on a top surface of the target wafer, a source die, the target wafer having a second alignment mark, the second alignment mark being at a position within 30 microns of a position corresponding to the first alignment mark at the nominal position of the source die, the second alignment mark having a third wall height, the third wall height being within 5% of a wall height of a waveguide on a top surface of the target wafer.

In some embodiments, the target wafer includes, on the top surface of the target wafer, a pillar configured to support the source die at the nominal position.

In some embodiments, a first portion of the pillar is under the nominal position of the source die, and a second portion of the pillar extends beyond the nominal position of the source die.

BRIEF DESCRIPTION OF THE DRAWINGS

These and other features and advantages of the present disclosure will be appreciated and understood with reference to the specification, claims, and appended drawings wherein:

Each of FIGS. 2A-3D is drawn to scale for a respective embodiment.

DETAILED DESCRIPTION

The detailed description set forth below in connection with the appended drawings is intended as a description of exemplary embodiments of a system and method for measuring misalignments between a source die and a target wafer provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
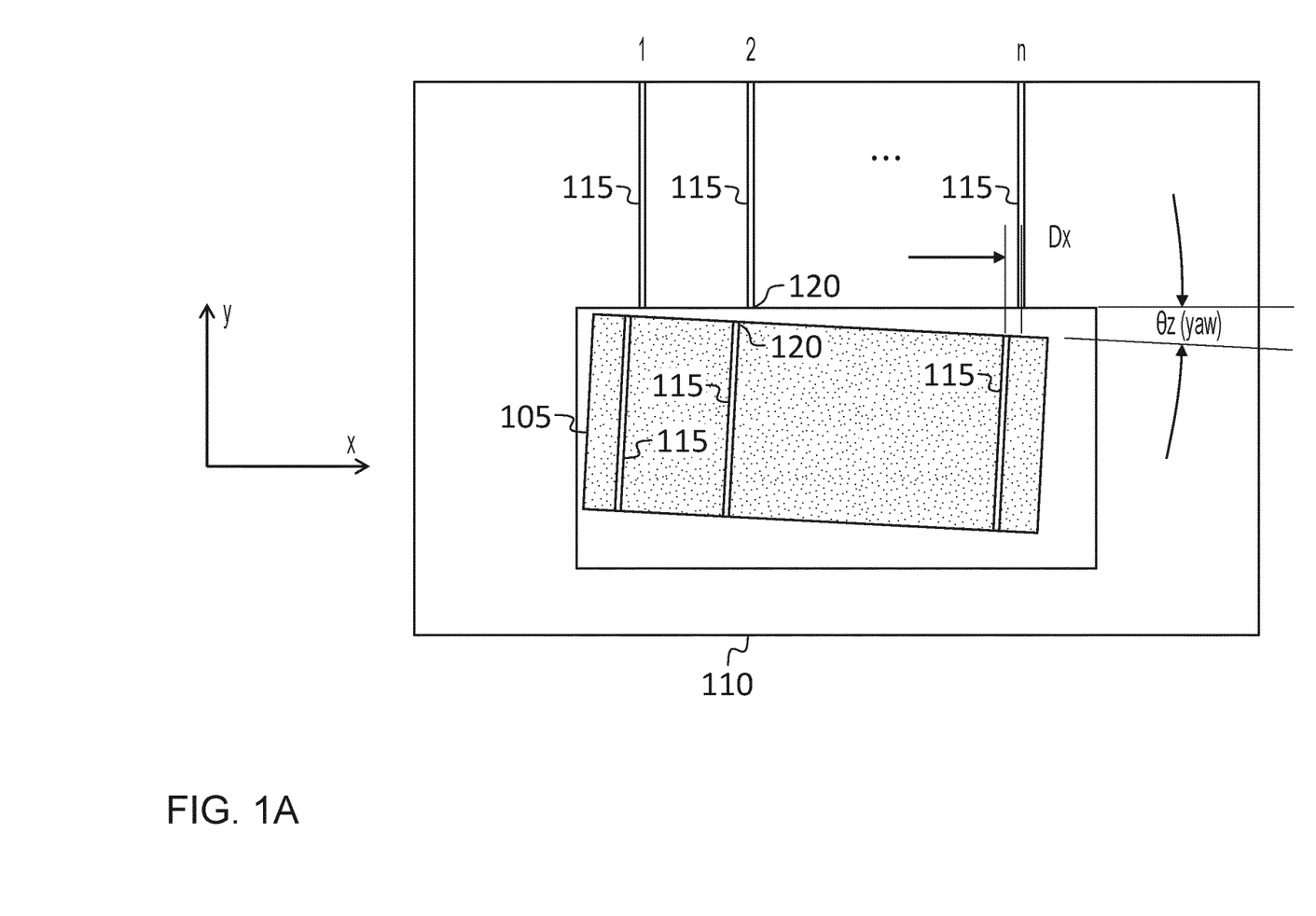
FIG. 1A is a schematic top view of a source die on a target wafer, according to an embodiment of the present disclosure.

Referring to FIG. 1A, in some embodiments, a source die 105 (e.g., a III-V chip) is bonded to a target wafer 110. The source die 105 includes a plurality of waveguides 115 (n waveguides, of which only the first, second, and nth waveguides are shown) each ending at a facet 120 near a corresponding facet 120 of a corresponding waveguide 115 on the target wafer 110. The alignment between the source die 105 and the target wafer 110 may be imperfect, as shown, with the source die 105 being offset from its correct, or "nominal", position by a translational misalignment $\Delta x$ and by an angular misalignment $\theta z$. This imperfect alignment may result in degraded coupling efficiency between pairs of corresponding waveguides, compared to a situation in which the source die 105 is correctly aligned with the target wafer 110.

Figure 1B:
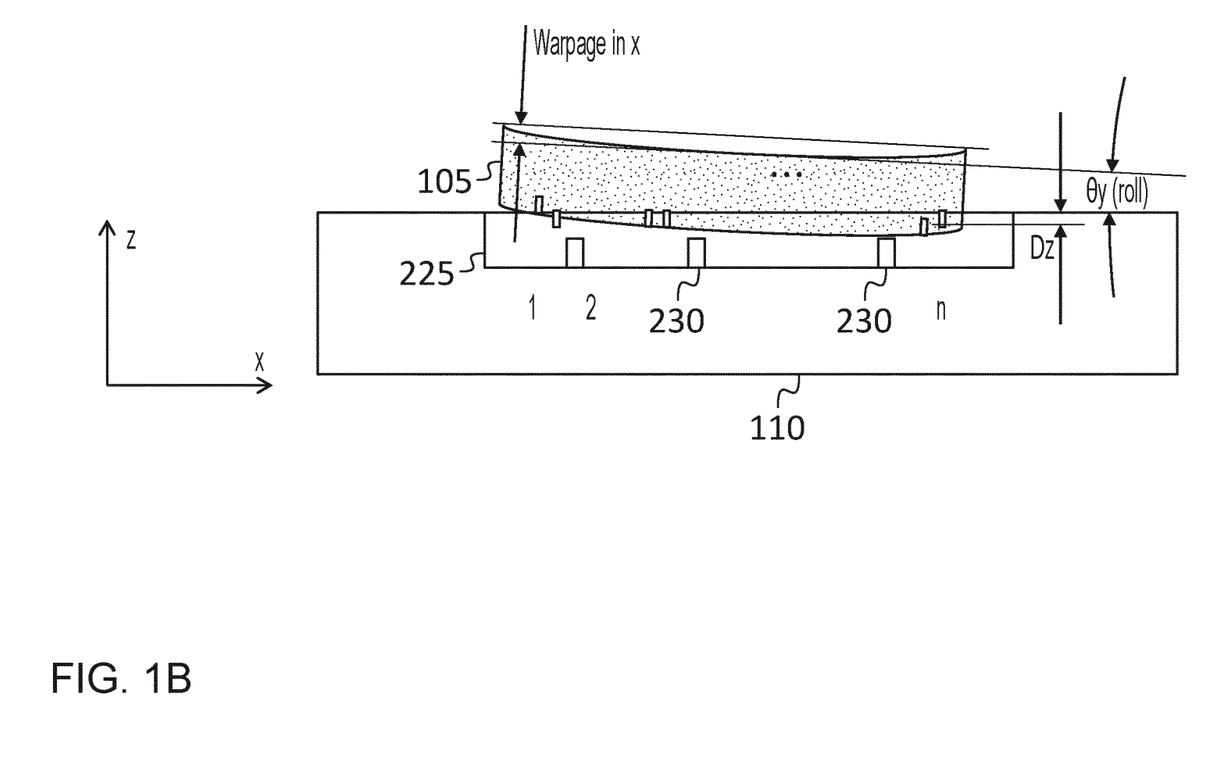
FIG. 1B is a schematic front view of a source die on a target wafer, according to an embodiment of the present disclosure.
Figure 1C:
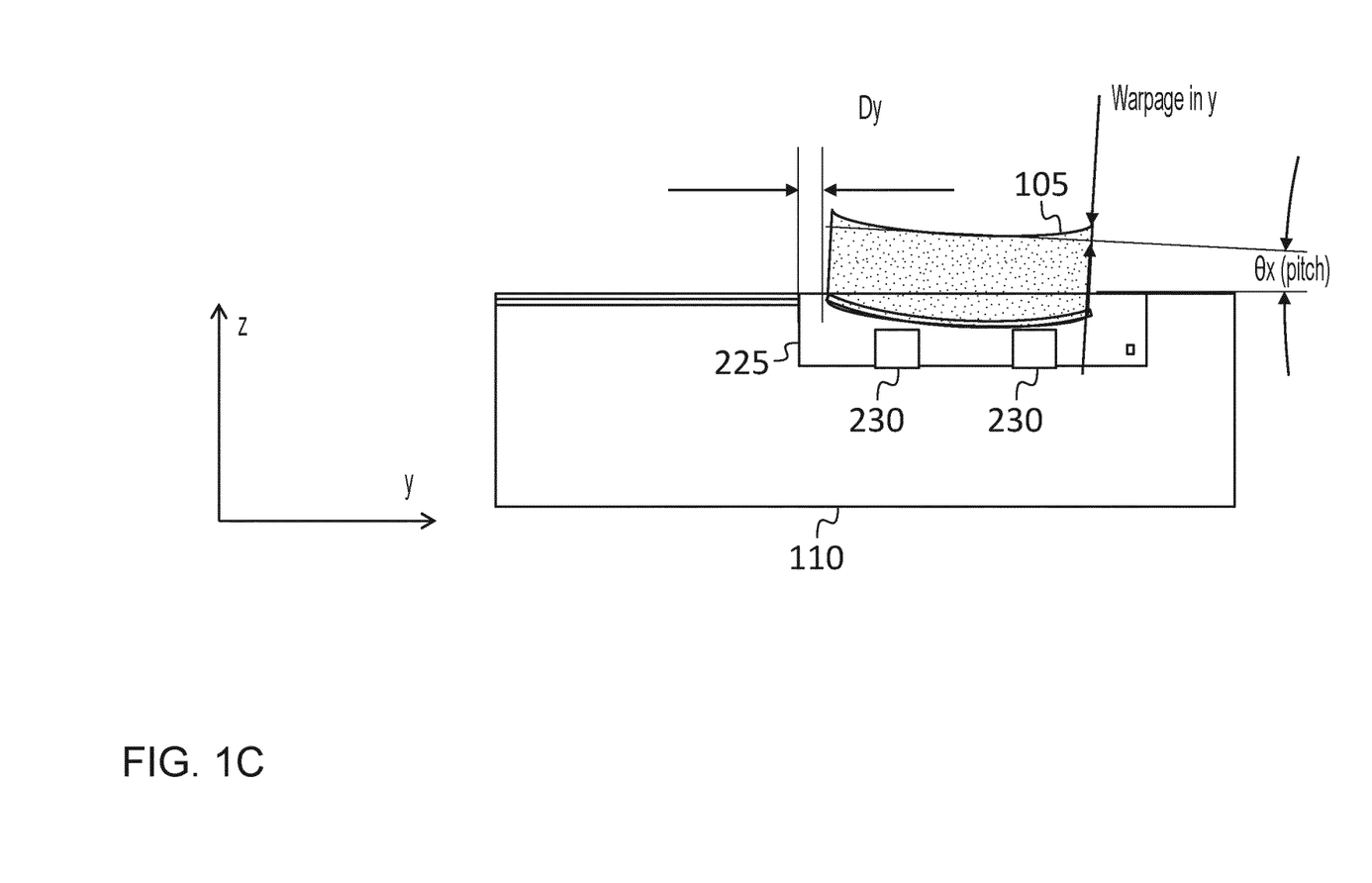
FIG. 1C is a schematic side view of a source die on a target wafer, according to an embodiment of the present disclosure.

FIGS. 1B and 1C show other misalignments, between the source die 105 and the target wafer 110, that also may result in degraded coupling efficiency between pairs of corresponding waveguides. For example, as shown in FIG. 1B, there may be a translational misalignment $\Delta z$ in the vertical direction (the direction perpendicular to the plane of the target wafer 110) and an angular misalignment $\theta y$, and, as shown in FIG. 1C, there may be a translational misalignment $\Delta y$ in the direction of the waveguides on the target wafer 110, and an angular misalignment $\theta x$. FIGS. 1B and 1C also show warpage of the source die 105 in x and in y respectively. As used herein, the term "misalignment" includes translational misalignments (e.g., displacement along x, y, or z), angular misalignments, and warpage. Each of the source die 105 and the target wafer 110 may be semiconductor chips fabricated by forming features (e.g., waveguides, active devices, and conductive traces) on a surface of a semiconductor wafer. This surface may be referred to as the "top surface", regardless of the orientation of the chip or wafer. For example, in the view of FIG. 1C, the top surface of the target wafer 110 faces up, and the top surface of the source die 105 faces down.

Figure 2A:
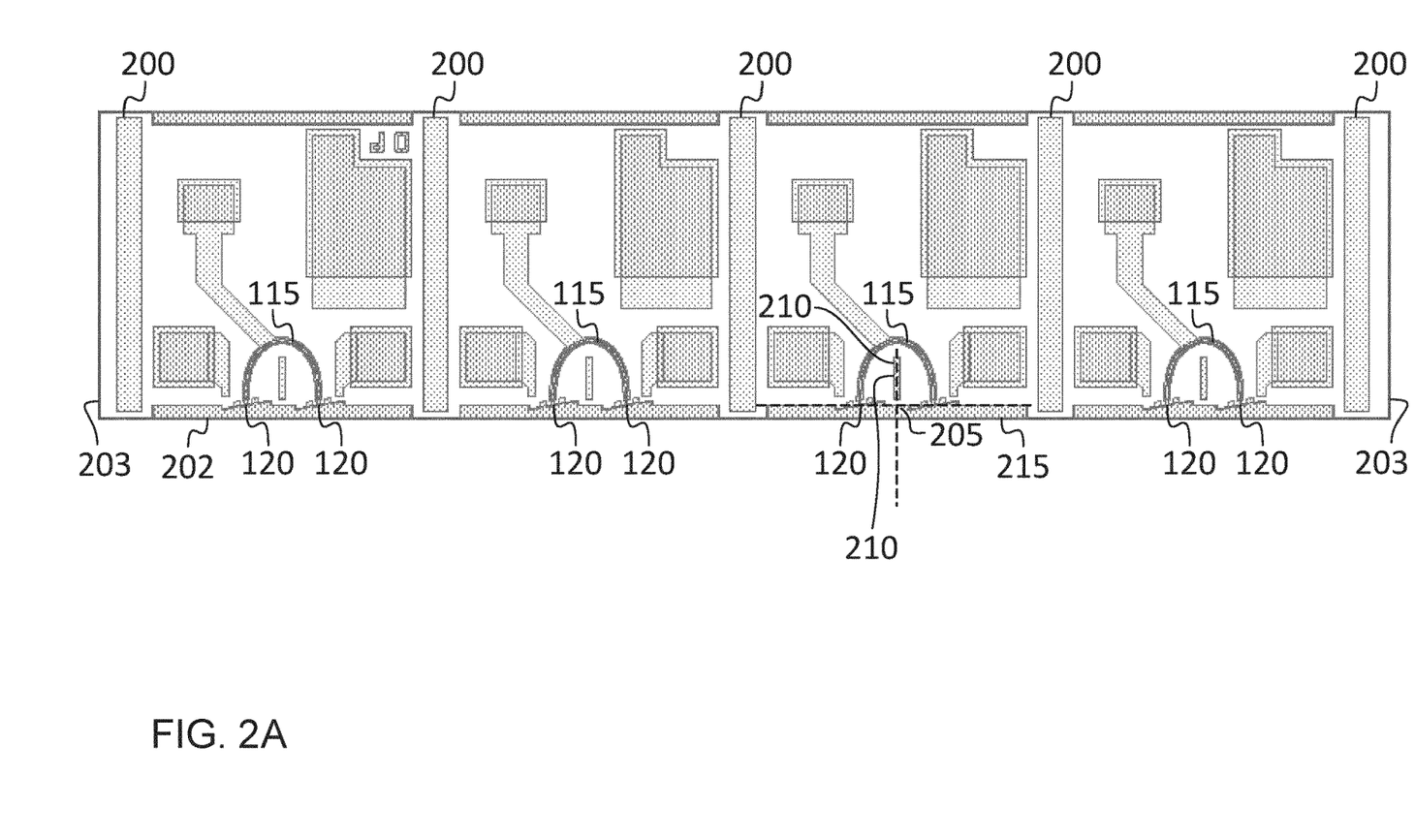
FIG. 2A is a top view of a source die, according to an embodiment of the present disclosure.

FIG. 2A is a top view of the source die 105 in which the top surface of the source die faces down, and in which the substrate of the source die 105 is drawn transparent so that the features on the top surface are visible. The top surface of the source die 105 includes a vertical alignment plane 200, which is a flat region, protruding above adjacent regions of the source die 105, suitable for abutting against pillars (discussed in further detail below) on the target wafer 110, for setting the height of the source die 105 when installed on the target wafer 110. The vertical alignment plane may be a single contiguous region or it may include several unconnected regions, as illustrated in FIG. 2A. FIG. 2A shows four waveguides 115, each including a modulator, and each being curved so that it has two facets (e.g., angled facets, as shown) at an edge (which may be referred to as the "front edge" 202) of the source die 105. In other embodiments one or more waveguides on the source die 105 may have only one facet at an edge of the source die 105 (e.g., if the other end of each waveguide is coupled to a laser on the source die 105).

The top surface of the source die 105 includes one or more fiducial marks 205 that may include (e.g., consist of) two substantially straight features that are not parallel (e.g., a first rectangular recess 210 and a second, substantially rectangular, recess 215). In the embodiment of FIG. 2A, the second, substantially rectangular, recess 215 also serves the function of providing the waveguide facets 120 (e.g., portions of the walls of the second recess 215 act as waveguide facets 120).

Figure 2B:
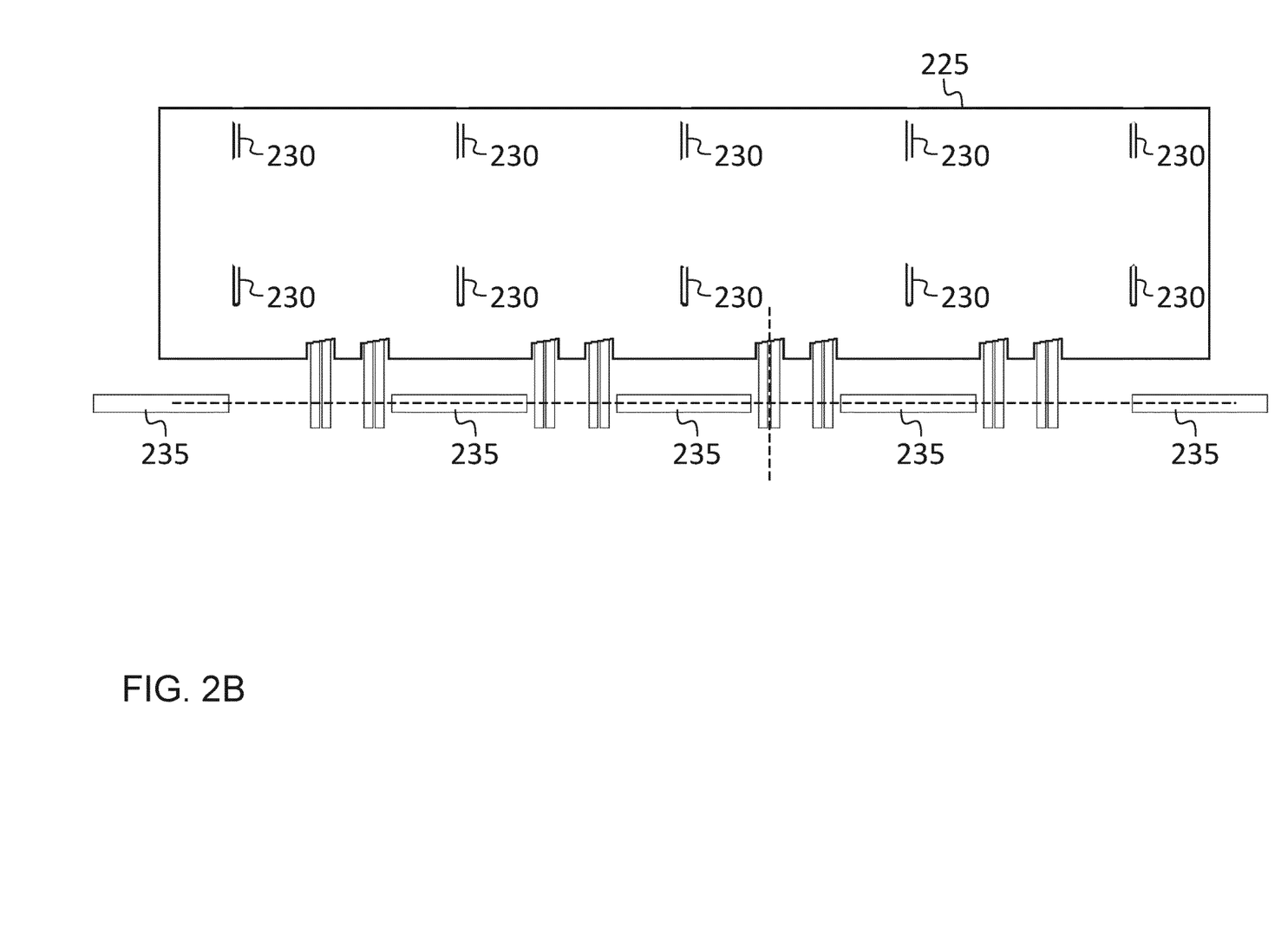
FIG. 2B is a top view of a target wafer, according to an embodiment of the present disclosure.

FIG. 2B is a top view of a portion of a target wafer 110, in some embodiments. A cavity 225 (also shown in FIGS. 1B and 1C) is etched in the top surface of the target wafer 110. One or more pillars 230 (also shown in FIGS. 1B and 1C) extend upward from the floor of the cavity 225; when, during assembly and bonding, the source die 105 is placed in the cavity, the pillars 230 may abut against the vertical alignment plane 200, to set the height of the source die 105 relative to the target wafer 110. Like the source die 105, the target wafer 110 may include one or more fiducial marks 205 that may include (e.g., consist of) two substantially straight features that are not parallel (e.g., a plurality of first rectangular recesses 235 and a straight waveguide 240).

During assembly and bonding, the target wafer 110 may be secured to a platform, and the source die 105 may be picked up by a holder. A first camera (or "back side camera") may obtain an image of the top surface of the source die 105; from this image the position of the features (including the waveguides 115 and the facets 120) on the top surface of the source die 105 relative to the holder may be determined in three degrees of freedom (x, y, and θz). A second camera may obtain an image of the top surface of the target wafer 110; from this image the position of the features (including the waveguides and facets) on the top surface of the target wafer 110 relative to the platform may be determined in three degrees of freedom (x, y, and θz). The source die 105 may then be placed in the cavity 225, on the pillars 230, using a "finger printing" feature of the assembly equipment, that correlates the position of the fiducial mark on the source die 105 to the position of the fiducial mark on the target wafer 110. The equipment may then place source die 105 on the target wafer 110 at a position determined based on (i) the position of the features on the top surface of the target wafer 110 relative to the platform and (ii) the position of the features (including the waveguides 115 and the facets 120) on the top surface of the source die 105 relative to the holder (which may in turn be determined based on the position of the fiducial mark on the source die 105 and the position of the fiducial mark on the top surface of the target wafer 110, respectively). As used herein, a "fiducial mark" is an alignment mark that is suitable for aligning the source die 105 to the target wafer 110 prior to bonding (and that may not be fully visible once the source die 105 has been bonded to the target wafer 110).

Figure 2C:
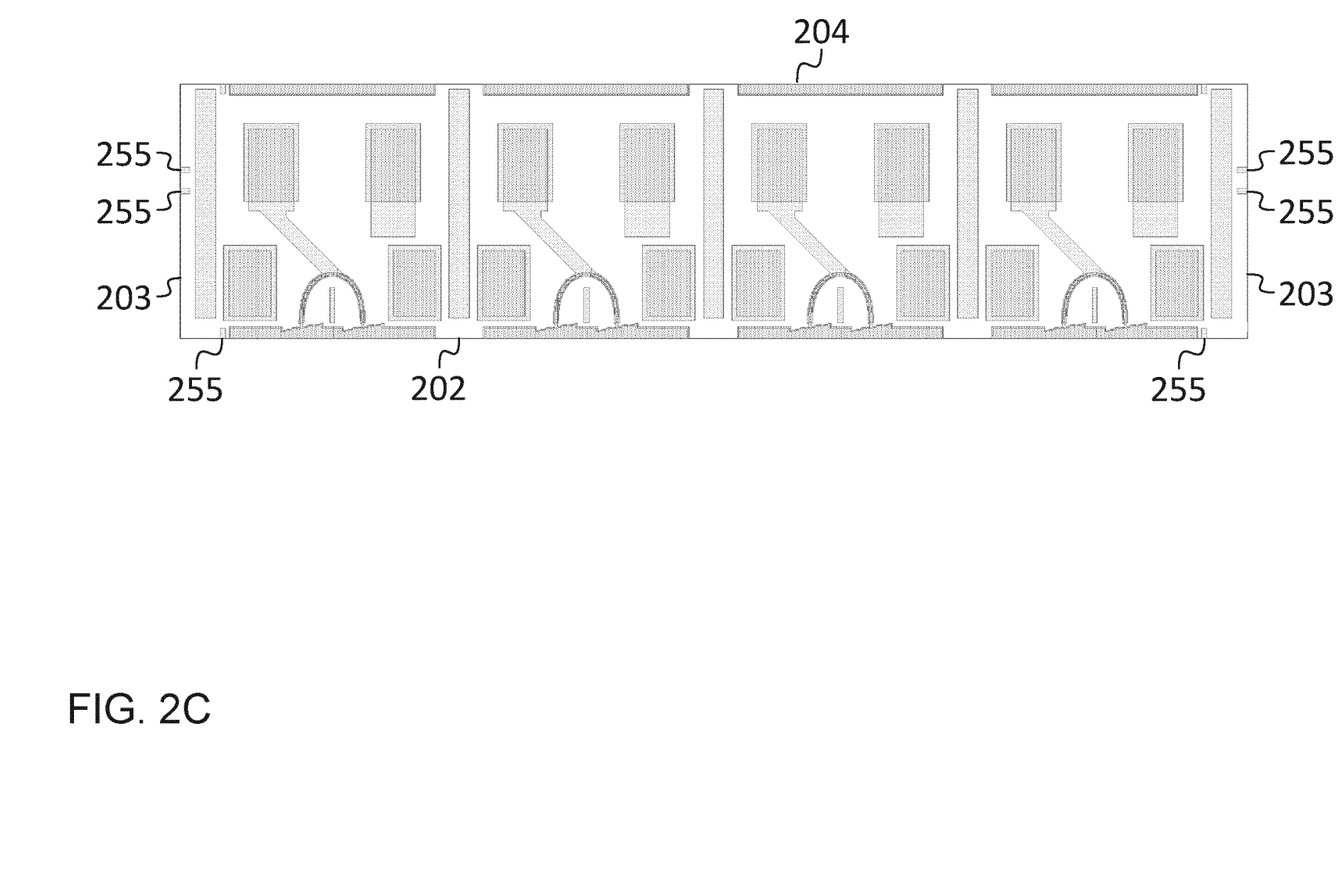
FIG. 2C is a top view of a source die, according to an embodiment of the present disclosure.

FIG. 2C is a top view of the source die 105, in which the top surface of the source die 105 faces down, and in which the substrate is drawn transparent so that the features on the top surface of the source die 105 are visible. In the embodiment of FIG. 2C, alignment marks 255 have been formed on the front edge 202 of the source die 105 and on two side edges 203 of the source die 105. These marks may be "self-aligned" with the waveguide facets 120 on the source die 105, in the sense that one etching operation is used to form the alignment marks 255 and the waveguide facets 120. As used herein, when several features are formed "in one etching operation" it means that a single mask is used (although several etching steps may be performed, with the same mask) so that mask registration errors do not affect the relative positions of the several features. Such features may, because they are formed at the same time, in one etching operation, have vertical sizes (e.g., wall heights, or recess depths) that are substantially the same, or within 5% of each other, for any pair of such features.

Figure 2D:
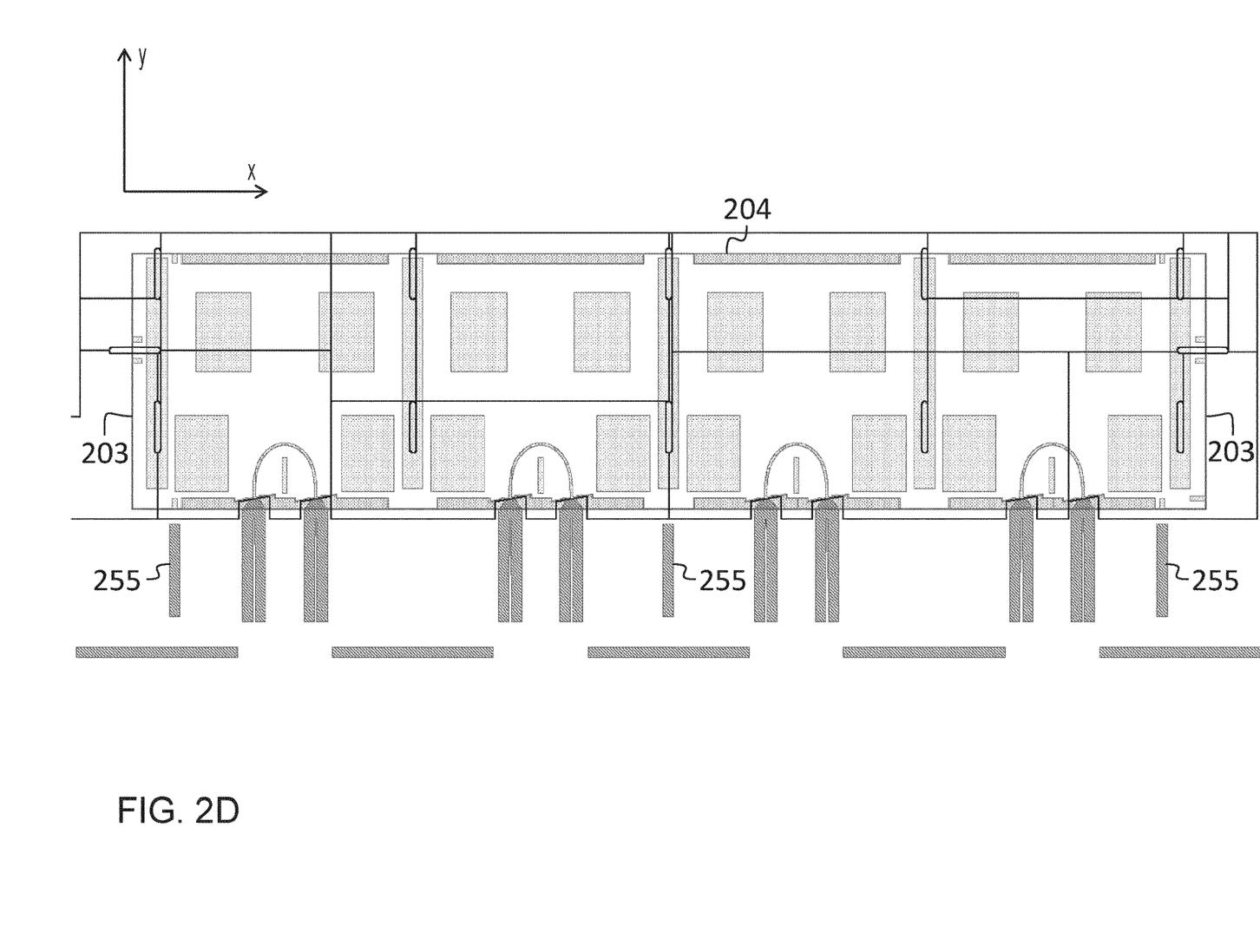
FIG. 2D is a top view of a source die on a target wafer, according to an embodiment of the present disclosure.

FIG. 2D is an image of the source die 105 overlaid on the target wafer 110. In FIG. 2D the source die 105 is drawn transparent so that the features on the top surface of the source die 105, and the features on the top surface of the target wafer 110, are visible. The target wafer 110 includes additional alignment marks 255 along the front edge 202 of the source die 105, from which offsets, along the x direction, from the corresponding alignment marks 255 on the front edge 202 of the source die 105, may be measured. The alignment marks 255 on the target wafer 110 may be self-aligned with the sidewalls of waveguides (e.g., the sidewalls of ribs of rib waveguides, or the sidewalls of strip waveguides) on the target wafer 110 (i.e., the alignment marks 255 may be formed at the same time as the waveguide sidewalls, in one etching operation).

In the embodiment of FIG. 2D, the pillars at the back edge 204 of the source die 105 are positioned to extend beyond the back edge 204 of the source die 105, as shown. For these pillars, offsets along the z direction (i.e., gaps) between the pillars 230 and the vertical alignment plane 200 may be measured. The target wafer 110 in this embodiment also includes additional pillars (not present in the embodiment of FIG. 2B) that are elongated in the x direction, each of which extends beyond a respective side edge 203 of the source die 105, and for each of which a gap between the pillar 230 and the source die 105 may be measured. The embodiment of FIG. 2D shows one such pillar extending beyond each of the side edges 203 of the source die 105. In some embodiments the target wafer 110 includes several pillars 230 extending beyond each of the side edges 203 of the source die 105; in such an embodiment, additional misalignment information may be obtained (as discussed in further detail below) by measuring the additional gaps present between the pillars 230 and the source die 105. Offsets, along the y direction, between (i) the pillars 230 that extend beyond the side edges 203 of the source die 105 and (ii) the alignment marks 255 on the side edges 203 of the source die 105 may also be measured. The pillars 230 may be self-aligned to the waveguide facets 120 on the target wafer 110 (i.e., the pillars 230 may be formed at the same time as the waveguide facets 120, in one etching operation). The lines joining the pillars 230 in FIG. 2D are artifacts of the process used the generate the image of the cavity 225 and the pillars 230 and do not represent physical features.

Figure 3A:
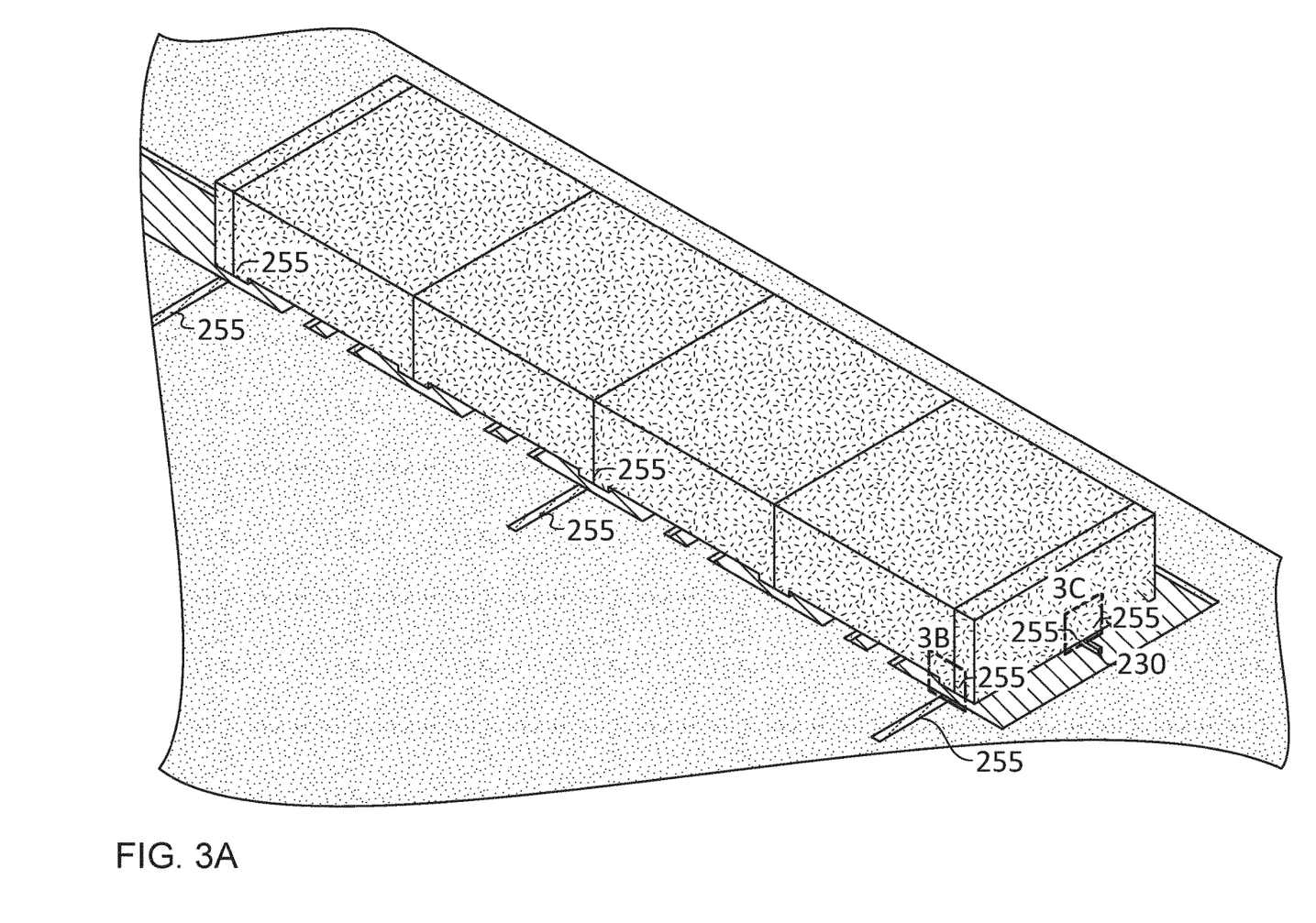
FIG. 3A is a perspective view of a source die on a target wafer, in some embodiments.
Figure 3B:
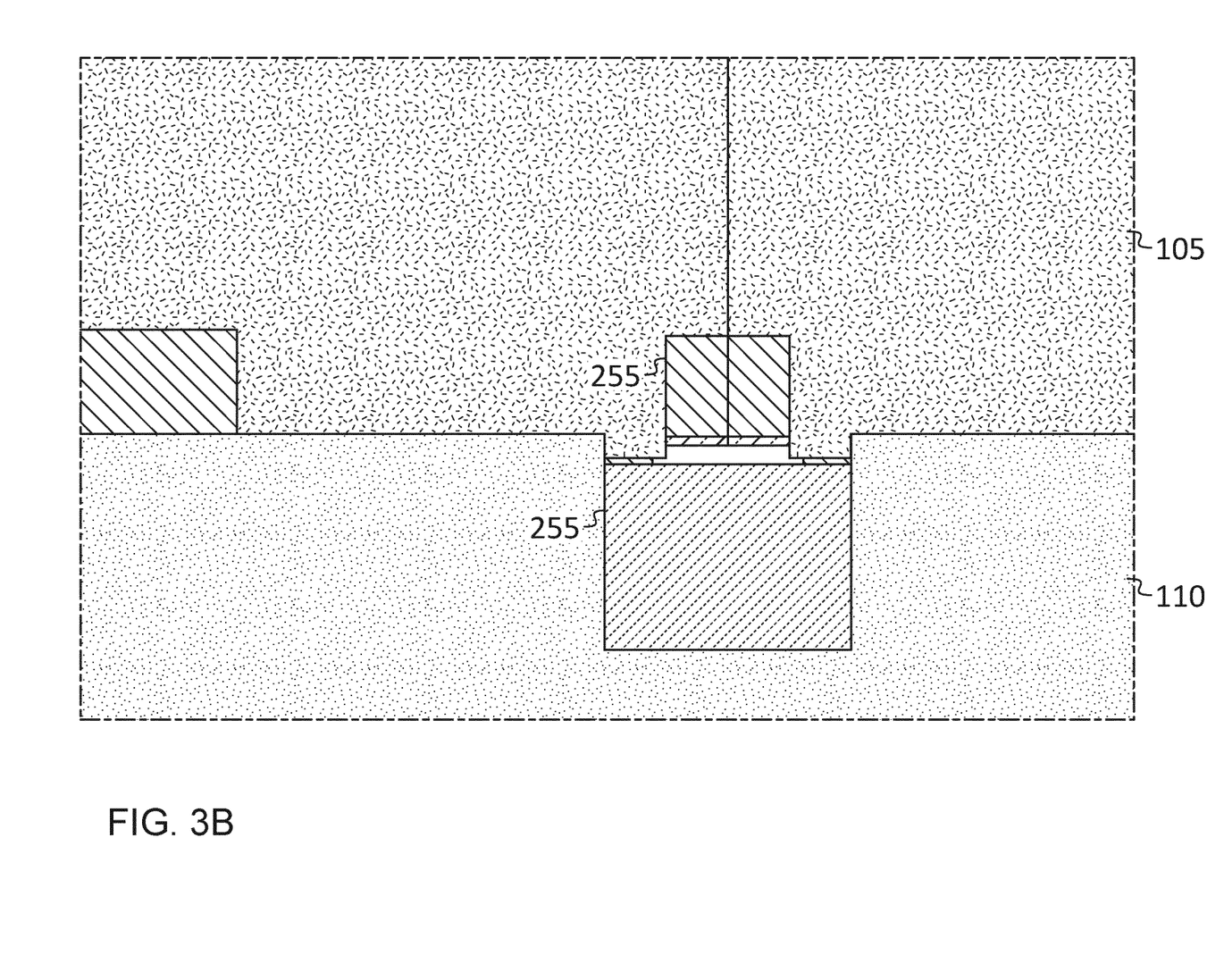
FIG. 3B is a perspective view of a portion, identified as portion 3B in FIG. 3A, of a source die on a target wafer, in some embodiments.
Figure 3C:
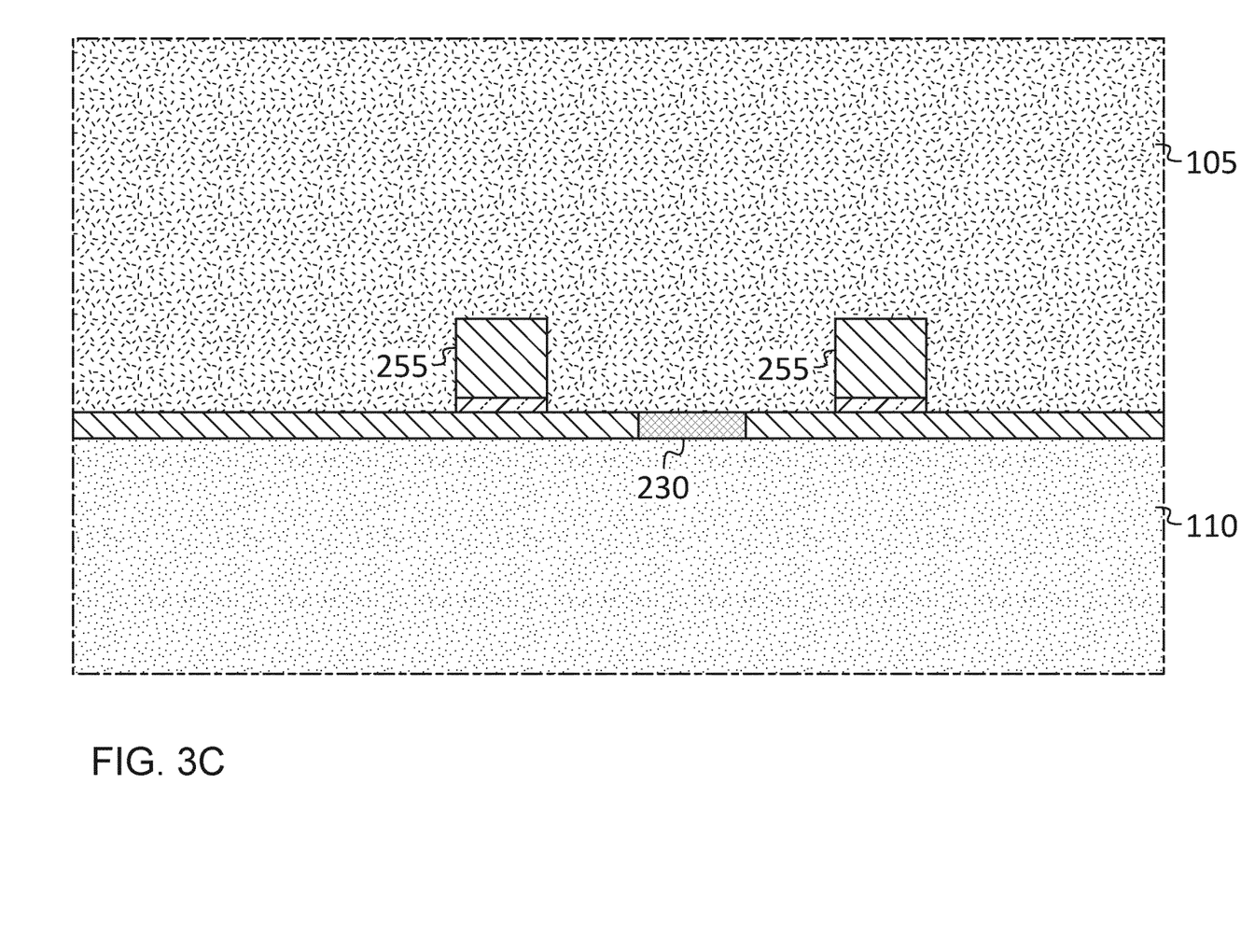
FIG. 3C is a perspective view of a portion, identified as portion 3C in FIG. 3A, of a source die on a target wafer, in some embodiments.
Figure 3D:
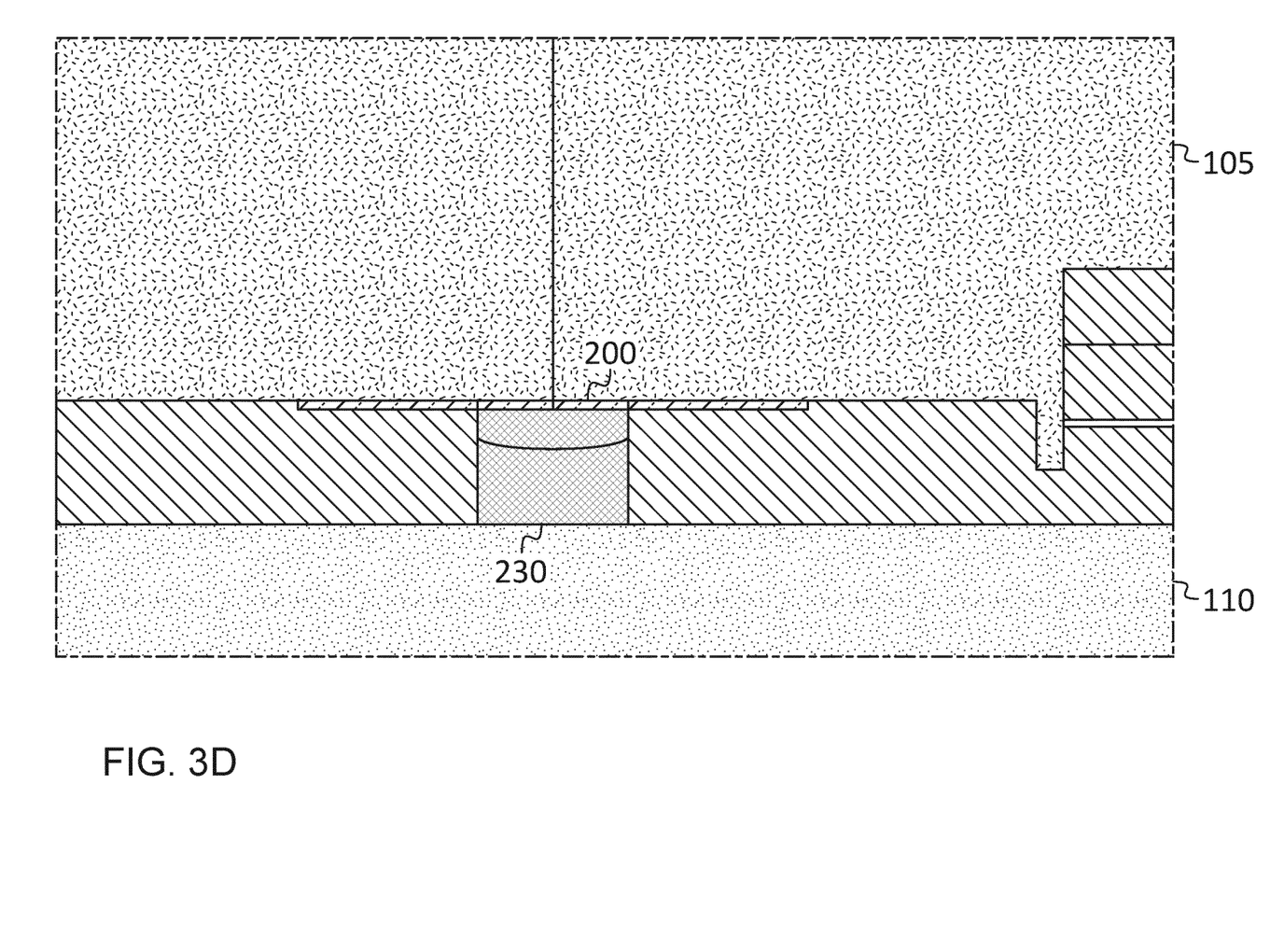
FIG. 3D is a perspective view of a portion, of a source die on a target wafer, the view including a portion of the rear edge of the source die, in some embodiments.

FIG. 3A is a perspective view of the source die 105 on the target wafer 110, in some embodiments. After the source die 105 is bonded to the target wafer 110, one or more cameras in a post-bonding inspection station may be used to acquire images of the combinations of alignment features (e.g., of the alignment marks 255 and pillars 230) on the source die 105 and on the target wafer 110 at several places along the edges of the source die 105. These images may show views like those illustrated in FIGS. 3B-3D (the regions corresponding to FIGS. 3B and 3C are shown in FIG. 3A; the region corresponding to FIG. 3D is at the back edge of the source die 105 and is not visible in FIG. 3A). The images may then be analyzed (e.g., by a human operator, or by suitable machine vision software) to measure one or offsets along one or more directions, between alignment marks 255 on the source die 105 and the corresponding alignment marks 255 on the target wafer 110. From these offsets, the error in the positioning (including warpage) of the source die 105 on the target wafer 110 may be estimated.

In some embodiments, the alignment marks 255 on the source die 105 along the front edge 202 of the source die 105 are separated by distances that are slightly less (or slightly greater) than the distances separating the corresponding alignment marks 255 on the target wafer 110, so that, together, the alignment marks 255 on the source die 105 and the corresponding alignment marks 255 on the target wafer 110 form a Vernier scale. In some embodiments the alignment marks 255 on the source die 105 are uniformly spaced at a first pitch, and the corresponding alignment marks 255 on the target wafer 110 are uniformly spaced at a second pitch, different (e.g., by 0.2 microns) from the first pitch. In other embodiments the spacing of the alignment marks 255 forming a Vernier scale is not uniform on one or both of the source die 105 and the target wafer 110. FIG. 3D shows three alignment marks 255 on the front edge 202 of the source die 105 and three corresponding alignment marks 255 on the target wafer 110; in some embodiments there are fewer (e.g., two) or more (e.g., five) such alignment marks 255 on each of the source die 105 and the target wafer 110.

Each side edge 203 of the source die 105 may have pairs of alignment marks 255, one on each side of the corresponding pillar 230, as shown in FIGS. 2D, 3A, and 3C. Such pairs of alignment marks 255 may help a human operator estimate the offset e.g., between the midpoint of the two alignment marks 255 of a pair and the pillar 230, by making it possible for the human operator to use the known separation between the two alignment marks 255 as a reference for scale. In such an embodiment, the two alignment marks 255 on the source die 105 may be considered to form a single composite alignment mark, and the offset measured may be the offset from the center of the composite alignment mark to the center of the pillar 230.

In some embodiments, one or more images are acquired from (i) an azimuth angle substantially perpendicular to the front edge 202 of the source die 105, (ii) an azimuth angle substantially perpendicular to one of the side edges 203 of the source die 105, (iii) an azimuth angle substantially perpendicular to the back edge 204 of the source die 105 and (iv) an azimuth angle substantially perpendicular to the other one of the side edges 203 of the source die 105. Each of these images may be acquired from an elevation angle, of, e.g., about 10 degrees. The effects of parallax related to the elevation angle from which an image is acquired, in a measurement of a gap between a pillar 230 and the source die 105, may be mitigated by, e.g., measuring the position of a shadow cast on the pillar 230 by light illuminating the source die 105 and the target wafer 110 from a known direction, or by acquiring an additional image from a different elevation angle.

The measured offsets may be used to calculate the misalignments between the source die 105 and the target wafer 110. For example, misalignment in x and misalignment in θy, may be calculated from the offsets, along the x direction, between the alignment marks 255 on the front edge 202 of the source die 105 and the corresponding alignment marks 255 on the target wafer 110. The misalignments in z (i.e., the error in the height of the source die 105 on the target wafer 110), in ex, and in By, and the warpage in x, and in y may be calculated from the gaps, or offsets, along the z direction, between the vertical alignment plane 200 (or the side edges 203 of the source die 105) and each of the pillars 230 which extend beyond an edge of the source die 105 (in an embodiment in which there are several such pillars 230 on each of the side edges 203). Misalignments in y and θz may be calculated from the measured offsets, along the y direction, between (i) the pillars 230 which extend beyond the side edges 203 of the source die 105 and (ii) the corresponding alignment marks 255 on the source die 105.

As used herein, an "alignment mark" is a mark suitable for performing optical alignment or for measuring an offset using an optical measurement. An "alignment feature" is a feature that may be used to measure errors in alignment or to perform alignment (e.g., by performing optical measurements of offsets between alignment features, or by arranging for alignment features to abut against each other, as in the case, for example, of the pillars 230 abutting against the vertical alignment plane 200). As such, an alignment mark is an example of an alignment feature, and each of the pillars 230 that extends beyond a respective edge of the source die 105 may function both (i) as an alignment mark 255 (when used to perform an optical measurement of an offset), and (ii) as an alignment feature more generally when used to abut against the vertical alignment plane 200. Similarly, the vertical alignment plane 200, or an edge of the vertical alignment plane 200 that may be visible in an image (as, e.g., in FIG. 3D) may also function as an alignment mark. An alignment mark may include (e.g., consist of) a plurality of alignment marks (such as, for example, the two alignment marks on one of the side edges 203 of the source die 105 in FIGS. 2C, 2D, 3A, and 3C). Measuring an offset between a first alignment mark and a second alignment mark may involve measuring a distance from any feature of the first alignment mark (e.g., from a left edge of the alignment mark or from a right edge of the alignment mark) to any feature of the second alignment mark.

As used herein, two features (e.g., planar surfaces, edges or directions) are "substantially parallel" when the angle between them (or between their normal vectors, in the case of two planar surfaces) is less than 5 degrees (or, if one feature is an edge or a direction and the other feature is a planar surface, they are "substantially parallel" when the angle between the edge or the direction and the normal vector of the planar surface is between 85 degrees and 95 degrees). As used herein, two features (e.g., surfaces or edges) are "substantially perpendicular" when the angle between them (or between their normal vectors, in the case of two planar surfaces) is between 85 degrees and 95 degrees (or, if one of the features is an edge or a direction and the other feature is a planar surface, they are "substantially perpendicular" when the edge or the direction is substantially parallel to the normal vector of the planar surface). As used herein, the "position" of an element (e.g., the "position" of the source die 105 relative to the target wafer 110) is a six-dimensional quantity including three translational degrees of freedom and three rotational degrees of freedom.

As used herein, "a portion of" something means "at least some of" the thing, and as such may mean less than all of, or all of, the thing. As such, "a portion of" a thing includes the entire thing as a special case, i.e., the entire thing is an example of a portion of the thing.

As used herein, the term "rectangle" includes a square as a special case, i.e., a square is an example of a rectangle, and the term "rectangular" encompasses the adjective "square". As used herein, when a second number is "within Y %" of a first number, it means that the second number is at least $(1-Y/100)$ times the first number and the second number is at most $(1+Y/100)$ times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as the second quantity.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for measuring misalignments between a source die and a target wafer have been specifically described and illustrated herein, many modifications and variations will be apparent to those skilled in the art. Accordingly, it is to be understood that a system and method for measuring misalignments between a source die and a target wafer constructed according to principles of this disclosure may be embodied other than as specifically described herein. The invention is also defined in the following claims, and equivalents thereof.

What is claimed is:

1. A method, comprising:
   measuring a first offset, the first offset being an offset along a first direction between a first alignment mark and a second alignment mark,
   the first alignment mark being an alignment mark on a first edge of a source die,
   the second alignment mark being an alignment mark on a target wafer, the first direction being substantially parallel to the first edge of the source die, and
   measuring a second offset, the second offset being an offset along a second direction between a third alignment mark and a fourth alignment mark,
   wherein:
   the third alignment mark is an alignment mark on a second edge of the source die,
   the fourth alignment mark is an alignment mark on the target wafer,
   the second edge of the source die is substantially perpendicular to the first edge of the source die,
   the second direction is substantially parallel to the second edge of the source die,
   the second direction is substantially parallel to the target wafer,
   the fourth alignment mark is a first pillar on the target wafer, and
   the method further comprises measuring a third offset, along a third direction, between a top surface of the first pillar and an alignment feature of the source die.

2. The method of claim 1, wherein:
   the target wafer is substantially planar, and
   the first direction is substantially parallel to the target wafer.

3. The method of claim 1, wherein:
   the source die comprises a waveguide, on a top surface of the source die, the waveguide having a facet at a third edge of the source die, and
   the method further comprises forming, in one etching operation:
   the first alignment mark, and
   the facet.

4. The method of claim 3, wherein the third edge is the same edge as the first edge.

5. The method of claim 1, wherein:
   the target wafer comprises a waveguide, on a top surface of the target wafer, the waveguide having a sidewall, and
   the method further comprises forming, in one etching operation:
   the second alignment mark, and
   the sidewall.

6. The method of claim 1, wherein:
   the third alignment mark is offset from the first pillar, on a first side of the first pillar, along the second direction,
   the source die comprises a fifth alignment mark, offset from the first pillar, on a second side of the first pillar, along the second direction, and
   the method comprises measuring one or more offsets, along the second direction, between the first pillar, the fourth alignment mark, and the fifth alignment mark.

7. The method of claim 1, wherein the third direction is substantially perpendicular to the target wafer.

8. The method of claim 1, wherein the alignment feature is an alignment plane.

9. The method of claim 1, wherein a first portion of the first pillar is under the source die, and a second portion of the first pillar extends beyond the second edge of the source die.

10. The method of claim 1, wherein:
    the target wafer comprises a waveguide having a facet, and
    the method further comprises forming, in one etching operation:
    the first pillar, and
    the facet of the waveguide of the target wafer.

11. The method of claim 1, wherein the first edge of the source die comprises a plurality of alignment marks including the first alignment mark, and
    the target wafer comprises a plurality of corresponding alignment marks including the second alignment mark, each of the corresponding alignment marks corresponding to a respective one of the alignment marks of the first edge of the source die,
    the alignment marks of the first edge of the source die and the corresponding alignment marks forming a Vernier scale.

12. The method of claim 11, wherein the plurality of corresponding alignment marks comprises five alignment marks.

13. The method of claim 1, wherein:
the target wafer comprises a second pillar,
a first portion of the second pillar is under the source die,
a second portion of the second pillar extends beyond a third edge of the source die,
the third edge of the source die is substantially parallel to the first edge of the source die, and
the method further comprises measuring a fourth offset, along a direction substantially perpendicular to the target wafer, between a top surface of the second pillar and an alignment feature of the source die.

14. The method of claim 1, wherein:
the top surface of the source die comprises a fiducial mark,
the target wafer comprises a fiducial mark, and
the method further comprises placing the source die on the target wafer at a position based on:
the position of the fiducial mark on the source die; and
the position of the fiducial mark on the top surface of the target wafer.

15. The method of claim 1, wherein the measuring of the first offset comprises acquiring an image, the image including the first alignment mark and the second alignment mark.

* * * * *